US009502085B2

(12) United States Patent
Shaeffer

(10) Patent No.: US 9,502,085 B2
(45) Date of Patent: Nov. 22, 2016

(54) MEMORY BUFFERS AND MODULES SUPPORTING DYNAMIC POINT-TO-POINT CONNECTIONS

(71) Applicant: Rambus Inc., Sunnyvale, CA (US)

(72) Inventor: Ian Shaeffer, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/672,442

(22) Filed: Mar. 30, 2015

(65) Prior Publication Data

US 2015/0206562 A1    Jul. 23, 2015

Related U.S. Application Data

(63) Continuation of application No. 13/566,181, filed on Aug. 3, 2012, now Pat. No. 9,025,409.

(60) Provisional application No. 61/515,499, filed on Aug. 5, 2011.

(51) Int. Cl.
   *G11C 7/10*  (2006.01)
   *G11C 5/04*  (2006.01)

(52) U.S. Cl.
   CPC .............. *G11C 7/1075* (2013.01); *G11C 5/04* (2013.01); *G11C 7/10* (2013.01)

(58) Field of Classification Search
   CPC ......... G11C 5/04; G11C 7/10; G11C 7/1057; G11C 2207/2245; G06F 12/0868; G06F 17/3053
   See application file for complete search history.

(56) References Cited

U.S. PATENT DOCUMENTS

| 7,363,422 | B2 | 4/2008 | Perego et al. | |
|---|---|---|---|---|
| 7,610,447 | B2 | 10/2009 | Perego et al. | |
| 2003/0158981 | A1* | 8/2003 | LaBerge | G06F 13/4243 710/100 |
| 2005/0166026 | A1 | 7/2005 | Ware et al. | |
| 2005/0216630 | A1* | 9/2005 | Gaskins | G06F 13/4072 710/100 |
| 2006/0129755 | A1 | 6/2006 | Raghuram | |

(Continued)

FOREIGN PATENT DOCUMENTS

WO    WO-2009-089301    7/2009

OTHER PUBLICATIONS

DocMemory, "What is LR-DIMM, LRDIMM Memory? (Load-Reduce DIMM)," dated Oct. 13, 2009, found online Feb. 8, 2011 at simmtester.com/.../printerFormat.asp?n . . . 4 pages.

(Continued)

*Primary Examiner* — J. H. Hur
*Assistant Examiner* — Ajay Ojha
(74) *Attorney, Agent, or Firm* — Silicon Edge Law Group LLP; Arthur J. Behiel

(57) ABSTRACT

A memory module comprises a module interface having module data-group ports to communicate data as respective data groups, a command port to receive memory-access commands, a first memory device including a first device data-group port, a second memory device including a second device data-group port, and a signal buffer coupled between the module interface and each of the first and second devices. In a first mode, in response to the memory-access commands, the signal buffer communicates the data group associated with each of the first and second device data-group ports via a respective one of the module data-group ports. In a second mode, in response to the memory-access commands, the signal buffer alternatively communicates the data group associated with the first device data-group port or the data group associated with the second device data-group port via the same one of the module data-group ports.

8 Claims, 5 Drawing Sheets

(56) References Cited

U.S. PATENT DOCUMENTS

| | | |
|---|---|---|
| 2008/0028135 A1 | 1/2008 | Rajan et al. |
| 2009/0119419 A1* | 5/2009 | Bae .................. G06F 13/4243 710/4 |
| 2009/0157994 A1 | 6/2009 | Hampel et al. |
| 2010/0211748 A1 | 8/2010 | Perego et al. |
| 2011/0016250 A1* | 1/2011 | Lee ...................... G11C 5/025 710/308 |

OTHER PUBLICATIONS

Dynamic Point-to-Point Technology dated Mar. 11, 2011, DRAM Solutions. 3 Pages.

Micron Technology, Inc., "Designing for High-Density DDR2 Memory," Technical Note, TN-47-16, Rev. B., Dec. 2009. 10 pages.

Rambus Inc., "Dynamic Point-to-Point Technology." found online at http://www.rambus.com/products/innovationslicensing/innovations/dpp.asp, dated Mar. 11, 2011, downloaded Oct. 12, 2005. 2 pages.

Rambus Inc., "Micro-Threading," dated Apr. 3, 2011, found online at rambus.com/in/.../microthreading.html. 4 pages.

Schuette, Michael, "Rambus/Kingston Threaded DDR3 Modules," dated Oct. 8, 2009, last updated Oct. 24, 2009. 8 pages.

Zheng et al., "Decoupled DIMM: Building High-Bandwidth Memory System Using Low-Speed DRAM Devices," ISCA '09, dated Jun. 20-24, 2009. 12 pages.

* cited by examiner

MEMORY BUFFERS AND MODULES SUPPORTING DYNAMIC POINT-TO-POINT CONNECTIONS

TECHNICAL FIELD

The subject matter presented herein relates generally to high-speed electronic signaling in support of memory access.

BACKGROUND

Processing units (PUs) execute instructions to read, manipulate, and write data. Both the instructions and data are commonly stored in a separate memory, which is coupled to the PU via a communication channel. In a common example, a personal computer (PC) normally includes a central processing unit (CPU) coupled to a quantity of dynamic, random-access memory (DRAM) via a channel called a "memory bus."

The speed at which a PU can process instructions depends in part on how fast the memory is able to read and write instructions and data, which in turn depends in part on the speed with which signals can be communicated over the memory bus. Faster computers require faster memory buses, so a considerable amount of resources have been expended improving the speed performance of memory buses.

Memory buses are commonly "multi-drop," which means that a number of memory devices can share the same channel. Multi-drop buses are desirable because they allow manufactures and users the flexibility to provide different types and amounts of memory. However, multi-drop buses tend to degrade memory signals, and thus reduce speed performance. An alternative to multi-drop buses, so-called "point-to-point" connections, directly connect the PU to the one or more memories, and thus avoid signal degradation that result from bus sharing. The problem with these systems is that point-to-point connection resources are wasted unless the memory system has the maximum number of memories. In a topology that supports two memory modules, for example, half the point-to-point interconnects would be wasted in a one-module configuration.

The assignee of the instant application developed "Dynamic Point-to-Point (DPP)" memory-bus technologies that allow manufacturers and users of computer systems the flexibility to provide different numbers of memory modules in a manner similar to multi-drop buses but without the wasted connection resources that can result in conventional point-to-point. In DPP memory topologies, the same number of point-to-point connections is used for different numbers of memories. Most memories and memory systems do not support DPP connectivity, and thus lack the benefits of these systems. There is therefore a need for methods and circuits for extending the advantages of DPP to additional types of memory resources.

BRIEF DESCRIPTION OF THE FIGURES

The figures are illustrations by way of example, and not by way of limitation. Like reference numerals in the figures refer to similar elements.

DETAILED DESCRIPTION

Figure 1:
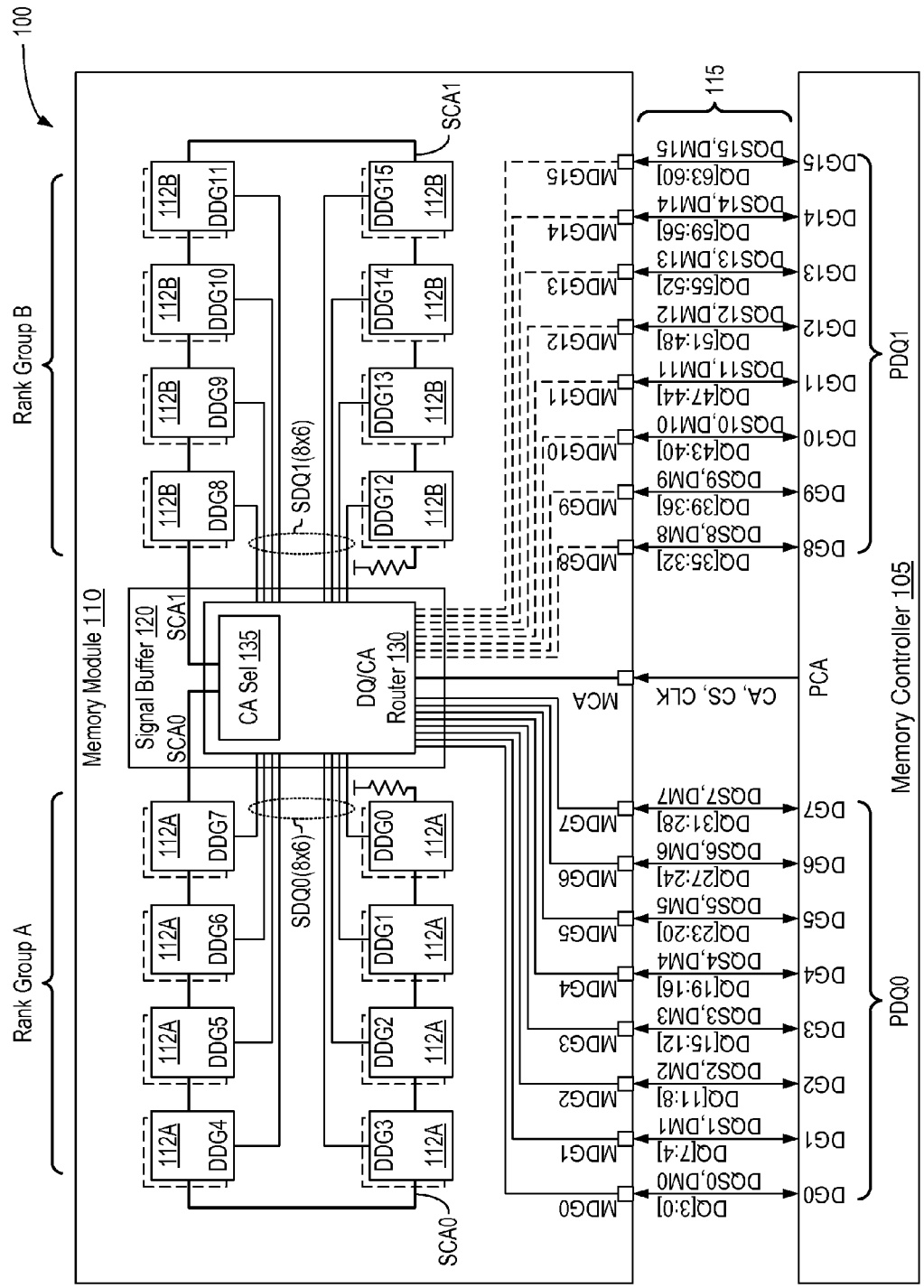
FIG. 1 depicts a memory system 100 that supports DPP extensibility.

FIG. 1 depicts a memory system 100 that supports DPP extensibility. System 100 typically resides on a motherboard, and includes a memory controller 105 interconnected with a memory module 110 via point-to-point data and control traces 115. Memory controller 105 can be a discrete integrated circuit (IC) or can be integrated with e.g. a CPU. Memory module 110 includes a number of IC memory devices 112A and 112B divided into two or more rank groups, rank groups A and B in this example. A signal buffer 120 manages communication between memory devices 112 and memory controller 105. In support of DPP interconnectivity, signal buffer 120 allows controller 105 to exchange data with all of memory devices 112 using either all of the data lines in control traces 115 in a single-module embodiment or half of those data lines in a dual-module embodiment. In the latter case, memory controller 105 employs the other half of the data lines to communicate with the memory devices in a second memory module. Much of the logic required to provide DPP functionality is included within signal buffer 120, which minimizes any changes that might otherwise be required in the memory devices and controller.

Memory module 110 includes a module interface that includes sixteen module data-group ports MDG[15:0] and a command port MCA, each of which is coupled to a corresponding port on controller 105 via sets of traces 115. As used herein, a "data-group port" includes a number of data pins that communicate respective data signals that are written to and read from memory, and may include at least one additional pin that communicates a signal other than data. The additional signal or signals of the data group are communicated between the same module interface and device as the data, and is subject to the same timing and routing constraints. In the depicted embodiment, each module data-group port includes four data (DQ) pins, a data-strobe (DQS) pin, and a data-mask (DM) pin adapted to communicate a data group of like-named signals. Command port MCA includes one or more pins adapted to communicate memory commands (CA), chip-select signals (CS), and a timing reference (CLK). These signals are exemplary and not exhaustive. In other embodiments, each data-group port can include a data-bus-inversion (DBI) pin, an error-detection-code (EDC) pin, etc., and the timing reference can be e.g. a strobe signal or some other signal with sufficient transition density to effectively convey phase information. In some embodiments controller 105 forwards a data clock signal to each memory device 112 via buffer 120 and receives a Timing Reference Signal (TRS) from each memory device during Read and Write operations. The signals communicated on the data and command ports may be e.g. serial or parallel, and may be differential or single-ended. These and other communication options are well known to those of skill in the art.

Each of memory devices 112A and 112B includes a command port and a respective device data-group port DDG[#]. The command port of each memory device is coupled to signal buffer 120 via one of two secondary command busses SCA[1:0]. The device data-group port of each memory device is coupled to signal buffer 120 via six of forty-eight traces in one of two secondary data busses SDQ[1:0]. In this embodiment, each device data-group port DDG[#] communicates the same data and related signals as a module data-group port MDG[#].

Each rank group includes sixteen memory devices, eight of which are labeled and eight of which are identified using dashed lines to indicate that they are mounted on the opposite side of module 110. Each memory device in rank group A shares six of forty-two (8×6) lines of a rank data bus SDQ0 with its mirror device on the opposite side of module 110; similarly, each memory device in rank group B shares six of forty-two (8×6) lines of a rank data bus SDQ0 with its mirroring device on the opposite side of module 110. In one such embodiment each access to a given rank reads from or writes to eight memory devices common to one side of the module. In this context, a "rank" refers to the number of memory devices used for a single memory access. As discussed below in more detail, buffer 120 can select between ranks and rank groups using e.g. a chip-select signal or an address bit expressed on module command port MCA.

Signal buffer 120 includes a data and command router 130, which in turn includes command select logic 135. Router 130 supports a full-width mode in which signal buffer 120, responsive to the memory-access commands on module command interface MCA, buffers signals between each of module data-group ports MDG[15:0] and a respective one of device data-group ports DDG[15:0] to facilitate full-width accesses to memory module 110. In the full-width mode, secondary command buses SCA0 and SCA1 can be used together to forward the same commands from module command port MCA to both rank groups of memory devices. For example, a column-access-strobe command received on module command port MCA might be buffered and applied to both command buses SCA0 and SCA1 substantially simultaneously. Many types of memory commands, including column-access-strobe commands, are well known to those of skill in the art. A detailed discussion of such commands is therefore omitted.

Responsive to access commands in the full-width mode, a rank of memory devices in each of rank groups A and B communicates data of width N to or from router 130, which allows router 130 to communicate data of width 2N to or from memory controller 105. In the depicted embodiment, each rank includes eight four-bit-wide memory devices, so the data width N from each rank group is thirty-two bits and router 130 communicates data of width 2N, or sixty-four bits. Memory devices provide data in eight-bit bursts (burst length M=8) in one embodiment to provide an access granularity of 512 bits (64×8=512) in the full-width mode.

Router 130 also supports a half-width mode in which signal buffer 120, responsive to the memory-access commands on module command interface MCA, buffers signals between each of module data-group ports MDG[7:0] and a respective one of either device data-group ports DDG[7:0] or DDG[15:8] to facilitate half-width accesses to memory module 110. In the half-width mode, rank-specific command buses SCA0 and SCA1 are used separately to forward commands from module command port MCA to only one rank group of memory devices. In the instant example, eight four-bit-wide memory devices in one of the two rank groups are read from or written to for each memory access, which allows for a module data width of 32 bits. Data is accessed in eight-bit bursts in one embodiment to provide an access granularity of 256 bits (32×8=256). The number of memory devices accessed during a read or write operation in the half-width mode is half the number accessed in the full-width mode, so power consumption on the module is considerably reduced.

Command (CA) select logic 135 can select between command buses SCA0 and SCA1, and consequently between rank groups A and B, using e.g. a chip-select signal or an address bit expressed on module command port MCA. For example, a column-access-strobe command received on module command port MCA might be buffered and applied to one of command buses SCA0 and SCA1, the selection based one or more chip-select or row-address bits. In some embodiments signal buffer 120 is programmable to select which command or address signal or signals are considered to distinguish between ranks or ranks groups.

In the example of FIG. 1, memory controller 105 supports sixteen data-group ports DG[15:0], also called "data-pin groups," and communicates with corresponding module data-group ports MDG[15:0] using a conventional protocol. One such protocol is defined by the DDR3 standard specified by the JEDEC Solid State Technology Association as JESD79-3D. Other exemplary protocols include other DDR protocols, graphics memory of the GDDR variety, low-power LPDDR, and XDR. The same communication protocol can be used on both sides of signal buffer 120, which simplifies adaptation of the DPP schemes to existing controller and memory-device ICs.

Figure 2:
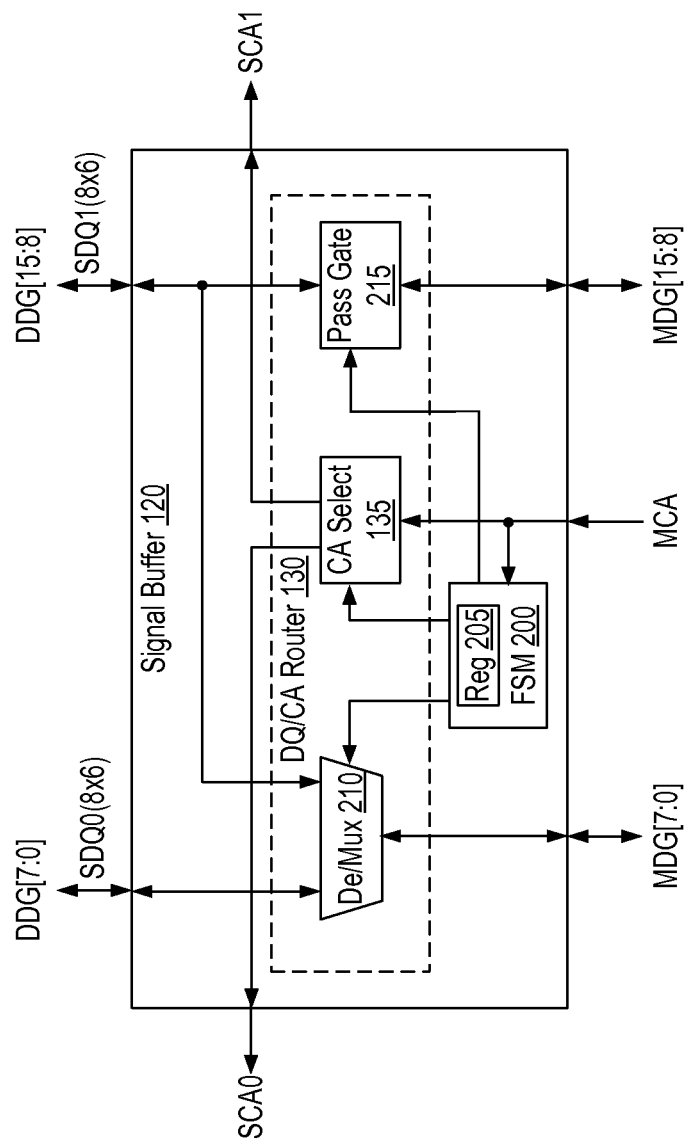
FIG. 2 details an embodiment of signal buffer 120 of FIG. 1.

FIG. 2 details an embodiment of signal buffer 120 of FIG. 1. As shown in FIG. 1, signal buffer 120 includes a data and command (DQ/CA) router 130, which in turn includes a command select logic 135. Signal buffer 120 additionally includes a finite state machine 200 with a mode register 205, a multiplexer/demultiplexer 210, and a pass gate 215. State machine 200, responsive to a command on module command port MCA, can load register 205 with a mode value indicative of the full-width mode or the half-width mode. Signal buffer 120 may include additional circuitry, to buffer data and command signals for example. In one embodiment this additional circuitry supports buffer functionality common to conventional load-reduced dual in-line memory modules (LRDIMMs), which employ a signal buffer to reduce memory-bus loading. LRDIMMs and suitable buffer circuitry are well understood by those of skill in the art.

In the full-width mode, state machine 200 enables pass gate 215 to provide buffered, bidirectional connections between each of the eight high-order module data-group ports MDG[15:8] and a corresponding one of eight device data-group ports DDG[15:8]. State machine 200 also controls router 130 such that multiplexer/demultiplexers 210 provides buffered, bidirectional connections between each of the eight low-order module ports MDG[7:0] and a corresponding one of eight device ports DDG[7:0] and configures command select logic 135 to pass module memory commands received on port MCA to both rank command buses SCA0 and SCA1. In one embodiment the resulting module functionality is indistinguishable from that of conventional LRDIMMs in this mode.

In the half-width mode, state machine 200 disables pass gate 215 to effectively decouple the eight high-order module data-group ports MDG[15:8] from device data-group ports DDG[15:8]. State machine 200, responsive to module commands received in command port MCA and to the operating mode or configuration, as represented by e.g. the program state of internal registers, controls multiplexer/demultiplexer 210 to couple each of the eight low-order module data-group ports MDG[7:0] to either a corresponding one of the low-order device data-group ports DDG[7:0] or the high-order device data-group ports DDG[15:0]. Also responsive to the same commands, state machine 200 controls command select logic 135 to pass module memory commands received on port MCA to the memory devices associated with the selected device data-group ports via one of command buses SCA0 and SCA1. As compared with the full-width mode, the half-width mode thus provides twice the number of memory addresses and half the data width. Additional address bits can be accommodated using e.g. additional row or column bits. The burst length is the same in both modes in this example, so the access granularity is also half in the half-width mode.

Figure 3A:
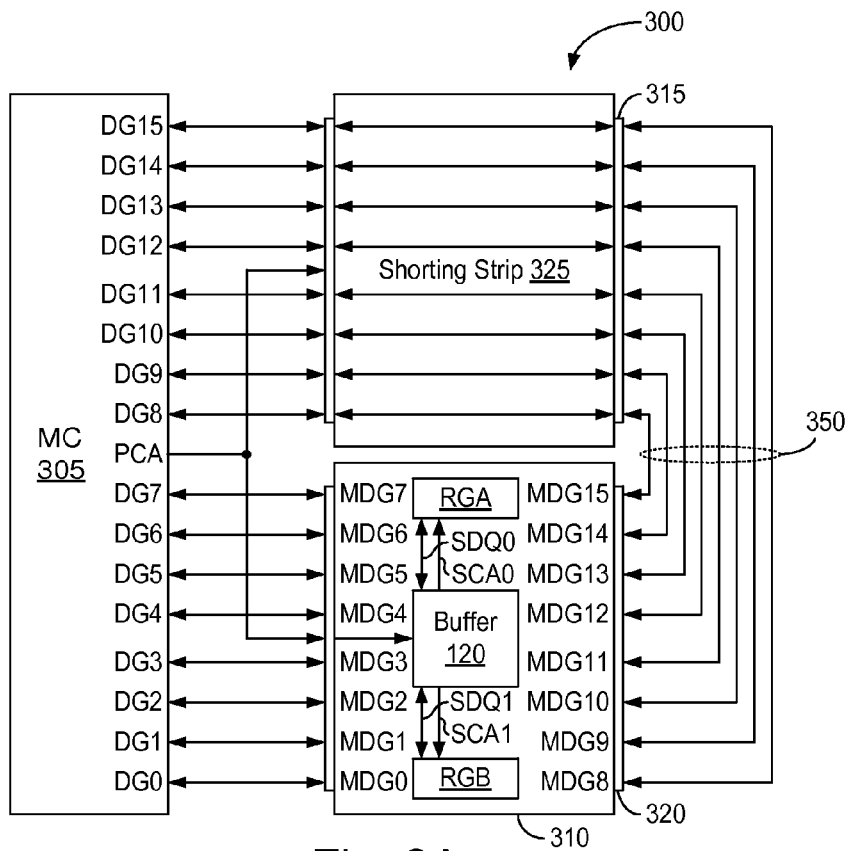
FIG. 3A depicts a memory system 300 that supports DPP connections between a memory controller 305 and either one or two memory modules 310.

FIG. 3A depicts a memory system 300 that supports DPP connections between a memory controller 305 and either one or two memory modules 310. Memory controller 305 and memory module 310 are as described above in connection with controller 105 and module 110. For ease of illustration, the memory devices of rank groups A and B of FIG. 1 are depicted as respective blocks RGA and RGB.

The elements of system 300 are mounted on a printed-circuit board that provides collections of conductive traces to facilitate communication between memory controller 305 and one or two memory modules 310. To simplify the inclusion of different numbers and types of memory modules, memory system 300 makes the connections using a pair of connectors 315 and 320, one for each of up to two memory modules. In this example each connector is represented as two rows of connections, one on either side of memory module 310, and a shorting strip 325. Shorting strip 325 is included to establish electrical connections between the high-order data-group ports DG[15:8] on the memory controller and the corresponding high-order module data-group ports MDG[15:8]. A collection of traces 350 is included to facilitate this connectivity.

Figure 3B:
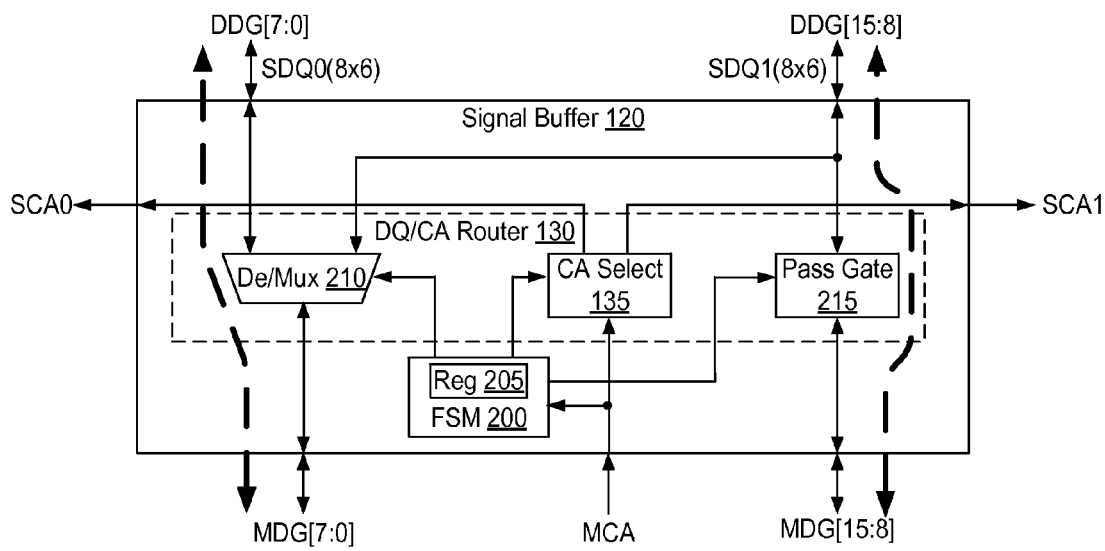
FIG. 3B depicts signal buffer 120 configured in support of the full-width mode consistent with the example of FIG. 3A.

FIG. 3B depicts signal buffer 120 configured in support of the full-width mode consistent with the example of FIG. 3A. Two bold dashed arrows indicate bidirectional data flow between module data-group ports MDG[15:0] and corresponding device data-group ports DDG[15:0] using both rank-specific data buses SDQ0 and SDQ1. (Device data-group ports DDG[15:0] are detailed above in connection with FIG. 1.) Commands received on module command port MCA are conveyed to both rank groups RGA and RGB via respective rank-specific command buses SCA0 and SCA1.

Figure 3C:
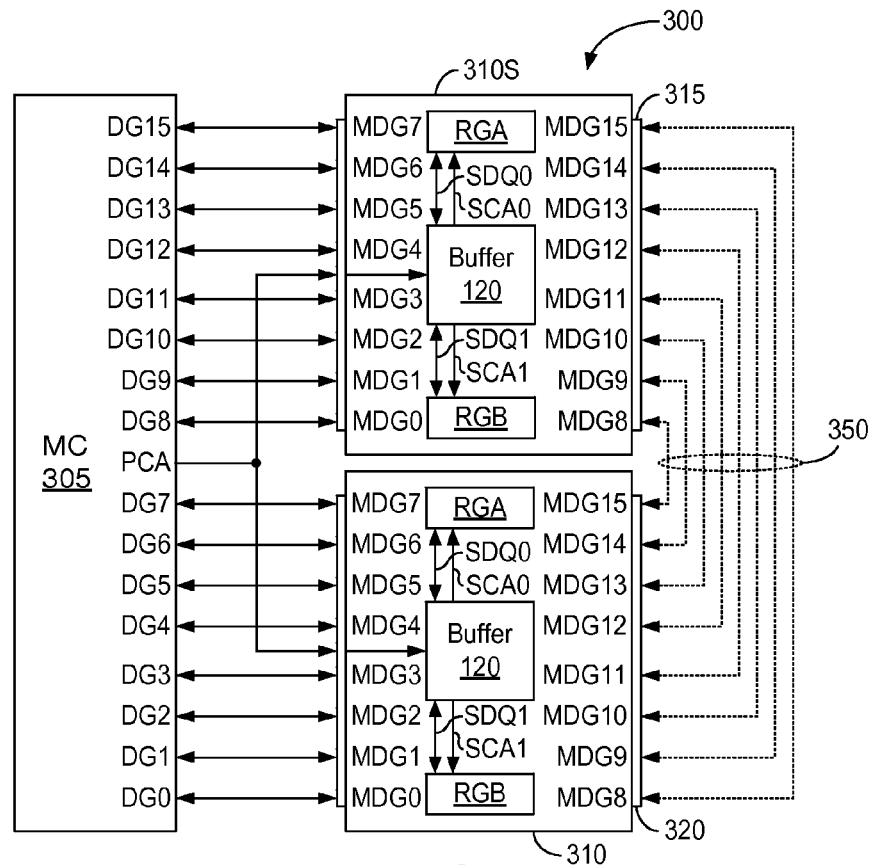
FIG. 3C depicts memory system 300 of FIG. 3A populated with two memory modules 310 rather than one.

FIG. 3C depicts memory system 300 of FIG. 3A populated with two memory modules 310 rather than one. Shorting strip 325 of FIG. 3A is omitted to make room for a second, identical memory module 310S. Each of modules 310 and 310S is configured to be in the half-width mode, in which case the high-order module data-group ports MDG[15:8] are disabled. Traces 350 are not used. Instead, the high-order controller data-group ports DG[15:8] communicate with the low-order module data-group ports MDG[7:0] of the uppermost memory module 310.

Figure 3D:
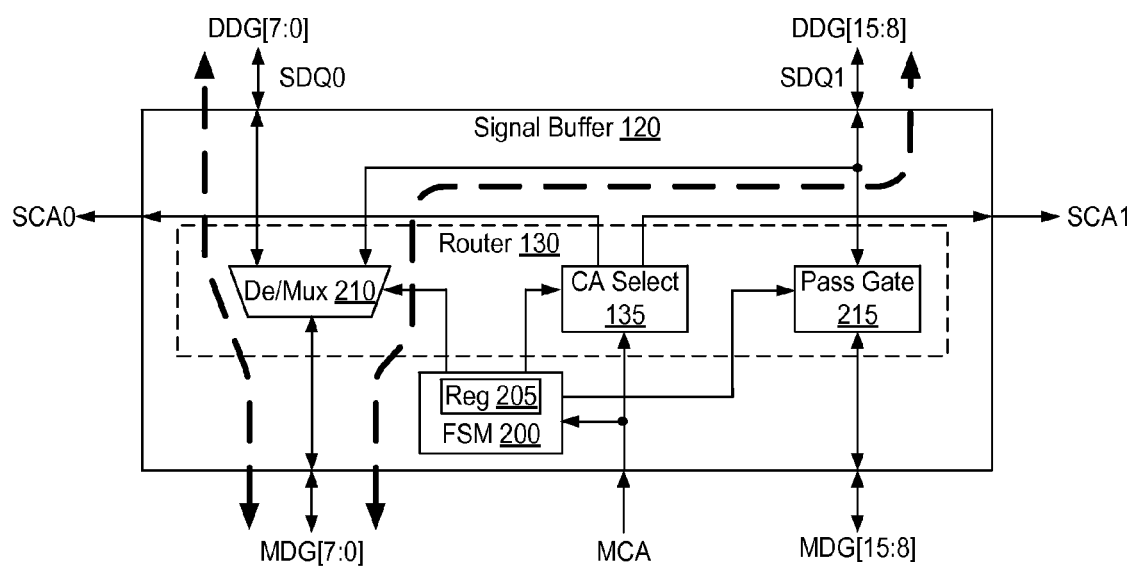
FIG. 3D depicts signal buffer 120 configured in support of the half-width mode consistent with the example of FIG. 3C.

FIG. 3D depicts signal buffer 120 configured in support of the half-width mode consistent with the example of FIG. 3C. Two bold dashed arrows indicate bidirectional data flow between module data-group ports MDG[7:0] and alternative corresponding device data-group ports DDG[7:0] or DDG[15:8] using alternative rank-specific data buses SDQ0 and SDQ1. Commands received on module command port MCA are conveyed to one of rank groups RGA and RGB via respective rank-specific command buses SCA0 and SCA1.

These commands are directed to one rank or the other based on e.g. one or more chip-select or row-address bits. In some embodiments signal buffer 120 is programmable to select which command or address signal or signals are considered in directing memory commands.

Figure 4:
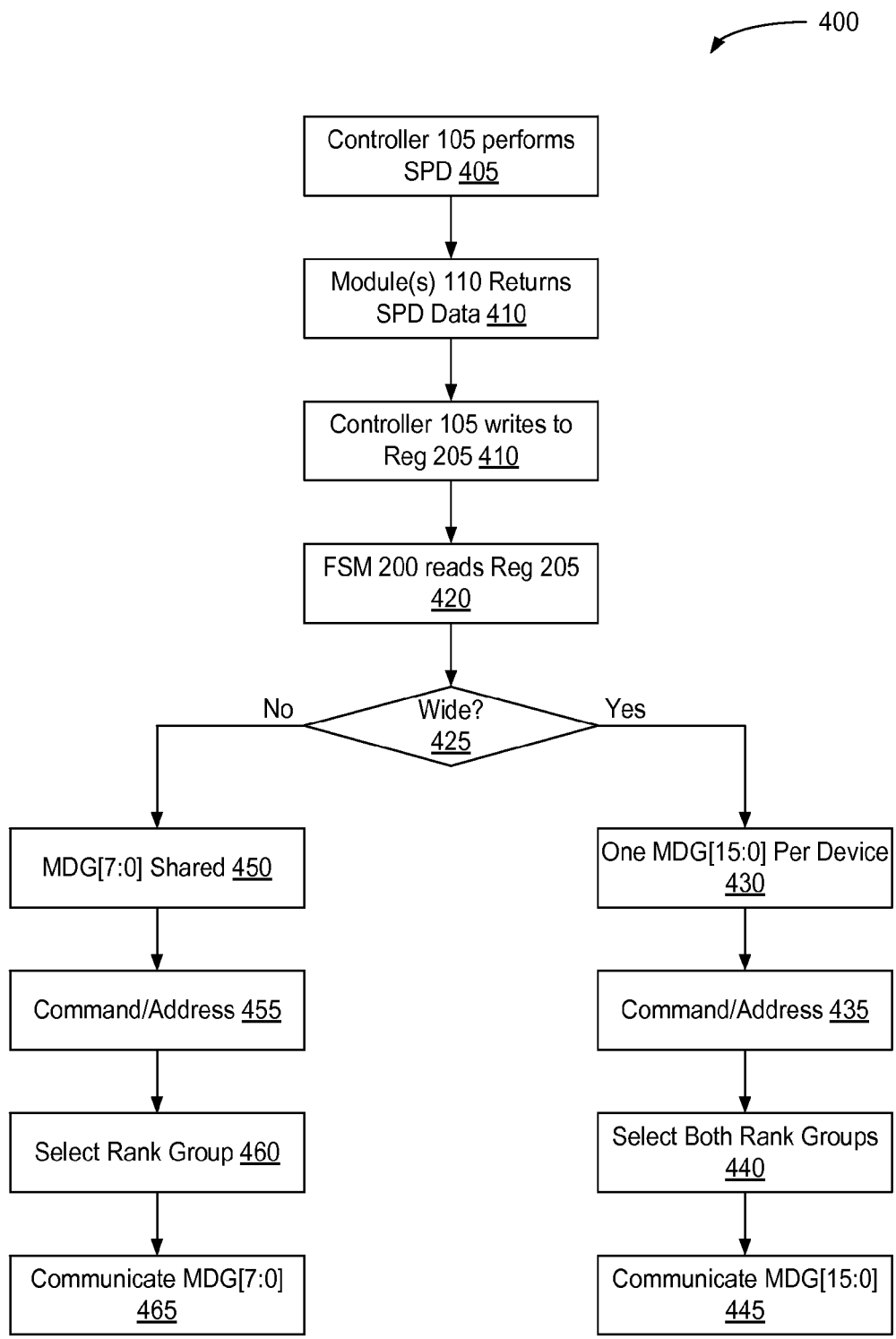
FIG. 4 is a flowchart 400 illustrating a power-on self-test (POST) process that an embodiment of system 100 of FIG. 1 employs to select between the single- and dual-module configurations illustrated above in connection with FIGS. 3A-3D.

FIG. 4 is a flowchart 400 illustrating a power-on self-test (POST) process that an embodiment of system 100 of FIG. 1 employs to select between the single- and dual-module configurations illustrated above in connection with FIGS. 3A-3D. Beginning with 405, when system 100 is powered up controller 105 communicates with serial presence detect (SPD) logic (not shown) on one or more installed modules 110. SPD logic can be instantiated on modules 110 as a dedicated IC or can be integrated into e.g. buffer 120. Any installed modules 110 return SPD data (410), which enables controller 105 to adapt system 100 to the available memory resources. The application of SPD logic and data is well known to those of skill in the art, so a detailed discussion is omitted.

Knowing what resources are available, controller 105 issues an instruction to each buffer 120 within an installed module 110 that causes the corresponding state machine 200 to load register 205 with a mode value indicative of an appropriate data width. Then, for each module, the respective state machine 200 reads the mode value of the corresponding mode register 205 (420).

Per decision 425, if the mode value indicates a wide data width, then state machine 200 configures DQ/CA router 130 to logically couple each of module data-group ports MDG [15:0] to a respective one of memory devices 112A and 112B (430). An example of such a configuration is illustrated in connection with FIGS. 3A and 3B. Commands received on module command port MCA (435) are thereafter simultaneously directed to both rank groups RGA and RGB via respective rank-specific command buses SCA0 and SCA1 (440), and data is communicated on all sixteen module data-group ports MDG[15:0] (445).

If the value read in 420 indicates a relatively narrow data width, decision 425 causes state machine 200 to instruct DQ/CA router 130 to logically couple half the module data-group ports MDG[7:0] to one rank group at a time (450). An example of such a configuration is illustrated in connection with FIGS. 3C and 3D. Commands received on module command port MCA (455) are thereafter directed to only one of rank groups RGA and RGB via the respective rank-specific command bus SCA0 or SCA1 (460). Relatively narrow data is then communicated on the eight low-order module data-group ports MDG[7:0] (465).

The foregoing embodiments are limited to memory systems that support two widths, but other embodiments are not so limited. Memory modules in accordance with other embodiments can be adapted to support different or additional widths. With reference to FIG. 1, for example, signal buffer 120 could be modified to support four rank groups in support of a memory module that can be configured in full, half, or quarter-width modes.

While the examples above discuss disabling of "high-order" data groups, other options are possible. In some embodiments, the data-group ports disabled may be others than the high-order groups. For example, the even-numbered ports may be disabled while the odd-numbered ports are enabled (or vice versa.) Other combinations are also possible.

In the foregoing description and in the accompanying drawings, specific terminology and drawing symbols are set forth. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. For example: the concepts detailed above can be extended to any combination of external and internal data widths; memory die in accordance with some embodiments can be soldered directly to a board and either permanently or programmably configured to a particular width; and the signal buffer can be provided on the motherboard, and possibly integrated with a memory controller, instead of included on the memory module with the memory devices.

Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A method for configuring a data width of a memory module, the memory module having memory devices and module data-group ports to communicate respective data groups, the method comprising:
   sensing a value indicative of the data width;
   responsive to a first value indicative of a first data width, coupling each module-data group port to a respective one of the memory devices;
   responsive to a second value indicative of a second data width, alternatively coupling a subset of the module data-group ports to a first or a second subset of the memory devices; and
   receiving first commands and, responsive to the first value and the first commands, issuing second commands to the memory devices or, responsive to the second value and the first commands, issuing third commands to one or the other of the first and second subsets of the memory devices.

2. The method of claim 1, wherein alternatively coupling the subset of the module data-group ports to the first or second subset of the memory devices comprises receiving a memory address and selecting between the first and second subsets of the memory devices based on the memory address.

3. The method of claim 1, wherein the numbers of memory devices in the first and second subsets of the memory devices are equal.

4. The method of claim 1, wherein the first data width is a factor of two greater than the second data width.

5. The method of claim 1, further comprising receiving a command to store the value indicative of the data width.

6. The method of claim 1, further comprising deriving the second or third commands from the first commands.

7. The method of claim 6, further comprising receiving an address and issuing the third commands to a selected one of the subsets of the memory devices based on the address.

8. The method of claim 7, wherein the first command includes the address.

* * * * *